(12) United States Patent
Anderson et al.

(10) Patent No.: US 7,642,582 B2
(45) Date of Patent: Jan. 5, 2010

(54) IMAGERS HAVING ELECTRICALLY ACTIVE OPTICAL ELEMENTS

(75) Inventors: Brent A. Anderson, Jericho, VT (US); John J. Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/850,798

(22) Filed: Sep. 6, 2007

(65) Prior Publication Data

US 2009/0065834 A1 Mar. 12, 2009

(51) Int. Cl.
*H01L 31/00* (2006.01)
*H01L 31/101* (2006.01)
(52) U.S. Cl. ............... 257/294; 257/291; 257/E27.133; 257/369
(58) Field of Classification Search ............ 257/72, 257/431, 291, E27.133, 294
See application file for complete search history.

(56) References Cited

U.S. PATENT DOCUMENTS

| | | | |
|---|---|---|---|
| 4,809,075 | A | 2/1989 | Akimoto et al. |
| 4,954,895 | A | 9/1990 | Akimoto et al. |
| 5,189,500 | A | 2/1993 | Kusunoki |
| 5,717,201 | A | 2/1998 | Lin et al. |
| 6,025,213 | A | 2/2000 | Nemoto et al. |
| 6,316,278 | B1 | 11/2001 | Jacobsen et al. |
| 6,384,460 | B1 | 5/2002 | Theil et al. |
| 6,462,840 | B1 | 10/2002 | Kravtsov |
| 6,590,346 | B1 | 7/2003 | Hadley et al. |
| 6,806,454 | B1 | 10/2004 | Zemlock |

(Continued)

FOREIGN PATENT DOCUMENTS

JP 6342900 A 12/1994

(Continued)

OTHER PUBLICATIONS

Losee et al., "AII-ITO Gate, Two-Phase CCD Image Sensor Technology", 2003 IEEE.

(Continued)

*Primary Examiner*—N Drew Richards
*Assistant Examiner*—Mamadou Diallo
(74) *Attorney, Agent, or Firm*—Scully, Scott, Murphy & Presser, P.C.; Anthony J. Canale (57) ABSTRACT

A CMOS image sensor comprising an array of active pixel cells. Each active pixel cell includes a substrate; a photosensing device formed at or below a substrate surface for collecting charge carriers in response to incident light; and, one or more light transmissive conductive wire structures formed above the photosensing device, the one or more conductive wire structures being located in an optical path above the photosensing device. The formed light transmissive conductive wire structures provide both an electrical and optical functions. An optical function is provided by tailoring the thickness of the conductive wire layer to filter light according to a pixel color scheme. Alternately, the light transmissive conductive wire structures may be formed as a microlens structure providing a light focusing function. Electrical functions for the conductive wire layer include use as a capacitor plate, as a resistor or as an interconnect.

14 Claims, 6 Drawing Sheets

U.S. PATENT DOCUMENTS

| | | | |
|---|---|---|---|
| 6,974,946 | B2 | 12/2005 | Yonezawa et al. |
| 6,993,872 | B2 | 2/2006 | Katsuragawa |
| 2004/0227061 | A1 | 11/2004 | Clevenger et al. |
| 2005/0173773 | A1 | 8/2005 | Kim |
| 2006/0261342 | A1* | 11/2006 | Wells .......................... 257/72 |
| 2007/0210398 | A1* | 9/2007 | Ohtsuki et al. .............. 257/431 |
| 2008/0002113 | A1* | 1/2008 | Abe et al. ................... 349/107 |

FOREIGN PATENT DOCUMENTS

JP  9321330 A  12/1997

OTHER PUBLICATIONS

Kasano et al., "A 2.0um Pixel Pitch MOS Image Sensor with an Amorphous Si Film Color Filter", 2005 IEEE International Solid-State Circuits Conference, pp. 348-349, 603.

* cited by examiner

IMAGERS HAVING ELECTRICALLY ACTIVE OPTICAL ELEMENTS

CROSS-REFERENCE TO RELATED APPLICATION

The present invention relates to commonly-owned, co-pending U.S. patent application Ser. Nos. 11/850,801 and 11/850,807 each filed concurrently with this application.

FIELD OF THE INVENTION

The present invention relates to semiconductor optical image sensors, and particularly, to a novel CMOS (complementary metal oxide semiconductor) image sensor cell structure including light transmissive conductive wiring for routing signals in CMOS imager devices to enable higher pixel densities and providing useful optical functions.

DESCRIPTION OF THE PRIOR ART

CMOS image sensors are beginning to replace conventional CCD sensors for applications requiring image pick-up such as digital cameras, mobile telephones, cellular telephones, pervasive digital devices such as PDA's (personal digital assistant), personal computers, medical devices, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Figure 1:
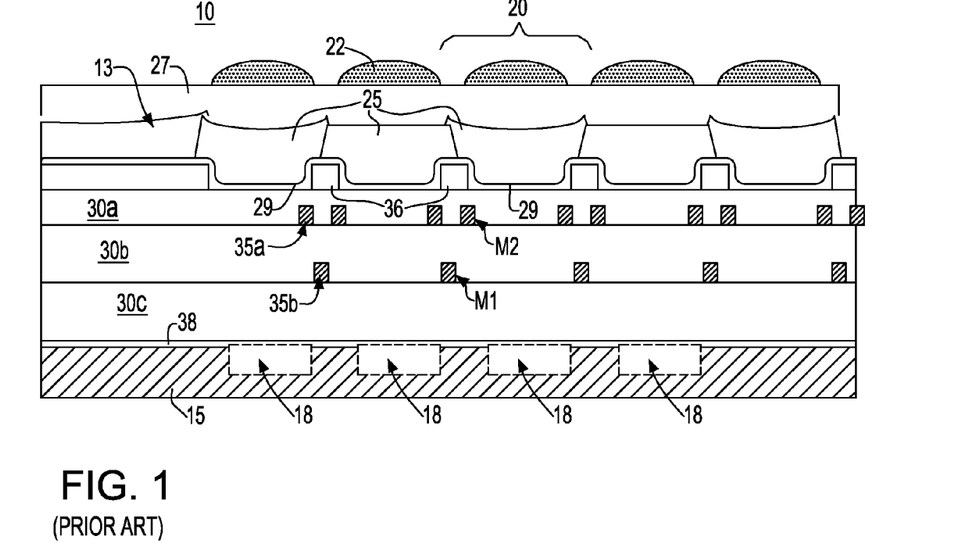
FIG. 1 depicts an array 10 of CMOS Active Pixel Sensor (APS) cells 20 according to the prior art.

Current CMOS image sensors comprise an array of CMOS Active Pixel Sensor (APS) cells, which are used to collect light energy and convert it into readable electrical signals. FIG. 1 depicts an array 10 of CMOS Active Pixel Sensor (APS) cells 20 according to the prior art. As shown, the array 10 comprises a plurality of microlenses 22, each having a hemispherical shape, arranged on a smooth planarization layer 27, e.g., a spin on polymer, that is formed on top of a color filter array 13 enabling formation of the microlens array. The color filter array 13 includes individual red, green and blue filter elements 25 (primary color filters) or alternately, cyan, magenta and yellow filter elements (complementary color filter). Each microlens 22 of the imager pixel array 10 is aligned with a corresponding color filter element 25 and comprises an upper light receiving portion of a pixel 20. The pixel 20 includes an APS cell portion fabricated upon a semiconductor substrate 15 that is used to collect light energy and convert it into readable electrical signals. The APS cell portion further includes a light sensitive element, e.g., a photo-sensing device 18 such as a photodiode that performs a photoelectric conversion, and one or more CMOS transistors (not shown) that perform charge amplification, switching and read-out. Each of the pixels 20 generates a signal charge corresponding to the intensity of light received by each pixel that is converted to a signal by the photoelectric conversion element (e.g., photodiode) formed on semiconductor substrate 15. In operation, the photosensing device 18, such as a photodiode, photogate, or photoconductor, overlies a doped region of a substrate for accumulating photo-generated charge in an underlying portion thereof A read-out circuit is connected to each pixel cell and often includes a floating diffusion region for receiving charge from the photosensitive element, when read-out. Typically, this is accomplished by a transistor device, e.g., a source follower transistor circuit, having a gate electrically connected to the floating diffusion region. The imager may also include a transistor, having a transfer gate, for transferring charge from the photosensitive element across a channel to the floating diffusion region, and a transistor for resetting the floating diffusion region to a predetermined charge level prior to charge transfer.

Figure 2:
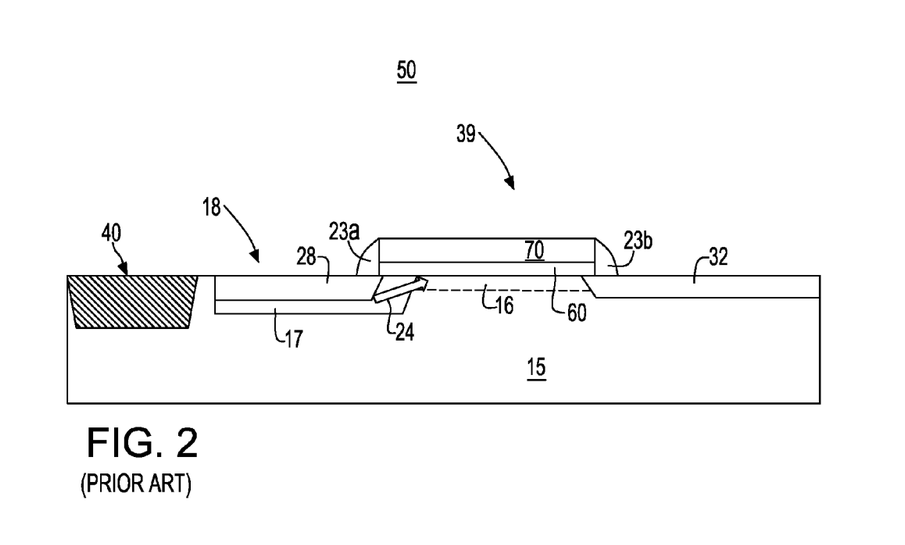
FIG. 2 depicts a CMOS Active Pixel Sensor (APS) cell 10 and associated sensor signal processing circuitry for an image sensor according to the prior art.

As shown in more detail in FIG. 2, a typical CMOS APS cell 50 includes a pinned photodiode 18 having a pinning layer 28 doped p-type and, an underlying lightly doped n-type region 17. Typically, the pinned diode 20 is formed on top of a p-type substrate 15 or a p-type epitaxial layer or p-well surface layer having a lower p-type concentration than the diode pinning layer 28. As known, the surface doped p-type pinning layer 28 is in electrical contact with the substrate 15 (or p-type epitaxial layer or p-well surface layer). The photodiode 18 thus has two p-type regions 28 and 15 having a same potential so that the n-type doped region 17 is fully depleted at a pinning voltage (Vp). As further shown in FIG. 2, the n-type doped region 17 and p region 28 of the photodiode 18 are spaced between an isolation region, e.g., a shallow trench isolation (STI) region 40, and a charge transfer transistor gate 39 which is surrounded by thin spacer structures 23a,b. The shallow trench isolation (STI) region 40 is located proximate the pixel image cell for isolating the cell from an adjacent pixel cell 20. In operation, light coming from the pixel is focused down onto the photodiode 18 where electrons collect at the n-type region 17. When the transfer gate 39 is turned-on, i.e., by routing a signal to apply a voltage to the transfer gate 39 comprising, for example, an n-type doped polysilicon layer 70 over a thin dielectric layer 60, the photo-generated charge 24 is transferred from the charge accumulating doped n-type doped region 17 via a transfer device channel 16 to a floating diffusion region 32, e.g., a floating "node" doped n+ type.

Referring back to FIG. 1, the above-described APS 20 includes a cell portion fabricated upon a semiconductor substrate 15 portion underneath a stack comprising one or more interlevel dielectric layers 30a-30c incorporating metallization interconnect levels M1, M2 Aluminum (Al) wire layers 35a, 35b. Interlevel dielectric materials may comprise a polymer or $SiO_2$, for example. Each APS cell 20 having the conductive metallizations 35a,b further includes a final metal level 36 (e.g., Al). A final passivation layer 29 is formed above the wire bonding level 36 that may comprise SiN, $SiO_2$, or combinations of these.

Figure 3A:
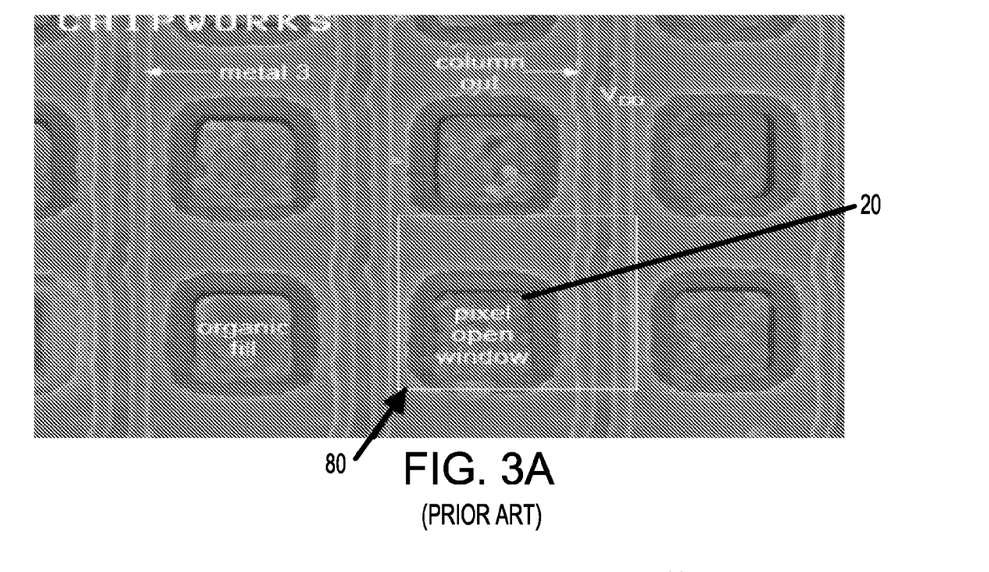
FIGS. 3A-3C illustrate, through top plan photomicrographic views, density of wiring to and from the CMOS Active Pixel Sensor (APS) cells at various metallization levels in accordance with the prior art.
Figure 3B:
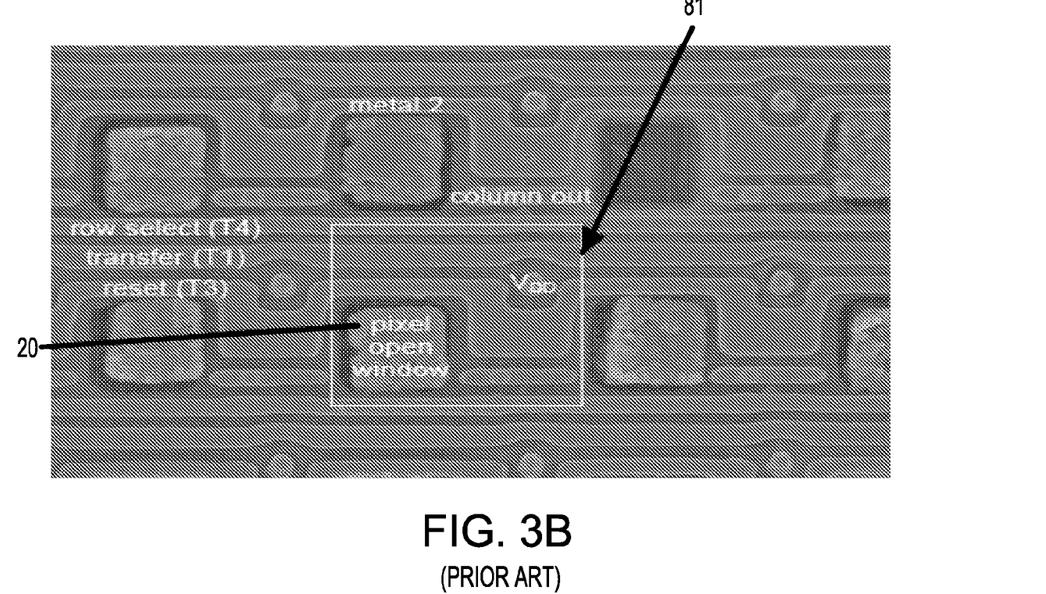
Figure 3C:
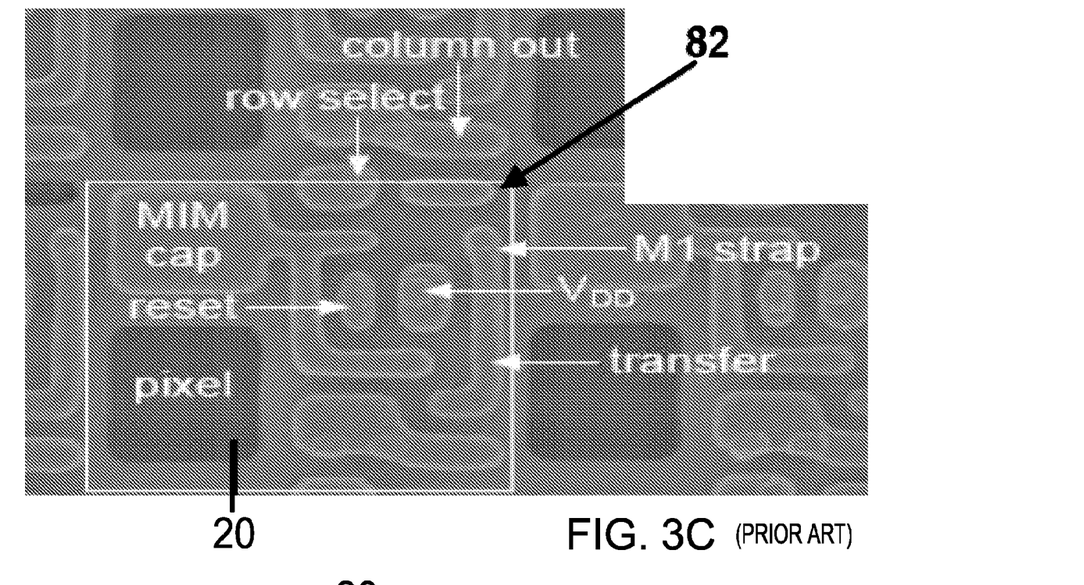

FIG. 3A-3C depict layout top plan views of an example state of the art pixel array such as the CMOS imager array 10 depicted as shown in FIG. 1, taken at various metallization levels: the M3 level (FIG. 3A), the M2 level (FIG. 3B), and the M1 level (FIG. 3C), with each figure showing various signal wire formations at each level associated with a pixel 20'. For example, FIG. 3A depicting a top view of an APS cell structure 20' taken at the M3 metallization level 80 showing the proximity between the photodetecting region of the active pixel sensor structure 20' and a Vdd signal line, a column out signal line, and M3 metallization lines. Similarly, FIG. 3B depicts a top view of the APS structure 20' of FIG. 3SA taken at the M2 metallization level 81 showing the proximity between the photodetecting region of the active pixel sensor 20' and a transfer signal line, a row select signal line, a reset signal line and, a Vdd conductor and, a column out signal line, and M2 metallization lines. Similarly, FIG. 3C depicts a top view of the APS structure 20' of FIG. 3A taken at the M1 metallization level 82 showing the proximity between the active pixel sensor 20 and each of the various signal lines shown in FIG. 3B including a MIMcap structure, a transfer signal line, a row select signal line, a reset signal line and, a Vdd conductor and, a column out signal line, and M1 metallization lines.

In view of FIGS. 3A-3C, it is clear that every imager APS cell requires that a substantial amount of signals be wired to and from it, e.g., a Vdd voltage supply signal, a row select signal, a reset signal, a transfer Gate signal, and column output signal, etc. Additionally, within CMOS imager devices is the requirement of intra-pixel wiring, e.g., to enable imager device functionality. For example, a connection from the floating diffusion to the gate of the source follower, a Vdd connection to both reset and source follower, and, a connection between source follower and row select and output. These connections and wirings take up a significant amount of pixel area, e.g., up to about 50%-70%, which leaves only about 30-50% of the pixel area open for light to pass through to the photodiode element. This continues to decrease as the pixel size decreases (e.g., from 3 um to 2.2 um cell sizes and beyond).

Figure 4:
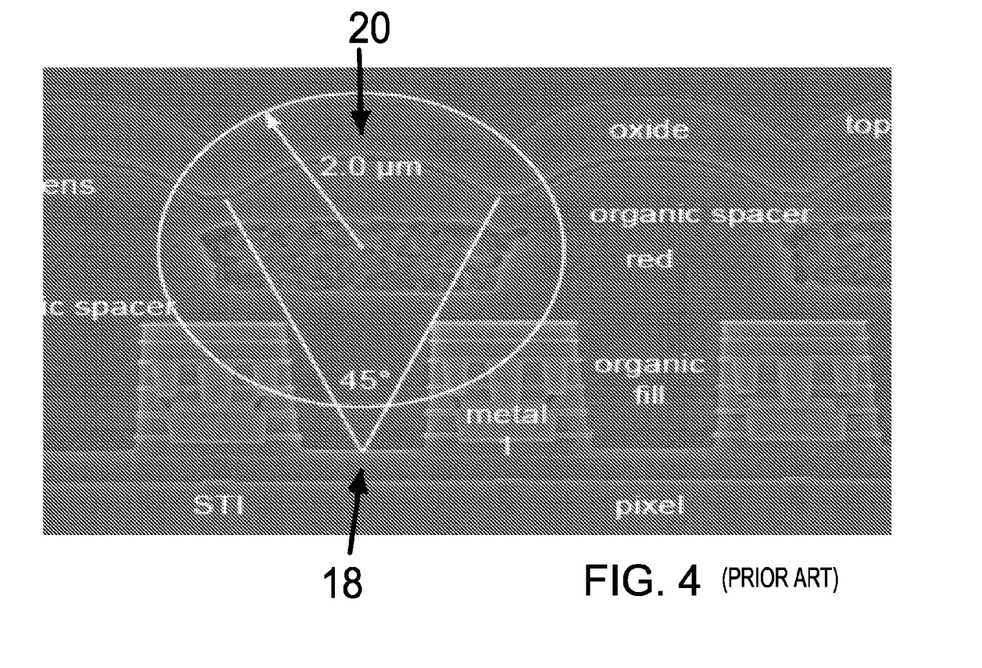
FIG. 4 illustrates, through a cross-sectional photomicrographic view, depicting an example state of the art pixel array such as the CMOS imager array 10.

Moreover, in the cross-sectional photomicrograph view of an example state of the art pixel array such as the CMOS imager array 10 depicted as shown in FIG. 4, it is clearly shown how light will pass through lenses and be focused onto the photosensing element, e.g., photodiode 18. Unfortunately, as seen in this example view, significant portions of the photodiode are shaded due to the opacity of the wiring.

As cost and collection angle are two key components of image sensor design competitiveness, the light collection angle is becoming more critical as image sensors in cell phones and other limiting environments want to improve image quality. While solutions in the art have been provided to ameliorate the crowding of pixel densities implementing transparent wiring, e.g., see U.S. Patent Publication No. 2005/0173773 and U.S. Pat. Nos. 5,717,201; 6,462,840; 6,806,454; 6,974,946 and, 6,993,872; and, implementing transparent inter-connects, e.g., see U.S. Pat. Nos. 5,189,500; 6,025,213; 6,316,278; 6,384,460; 6,590,346; and, JP 9321330, these solutions still are cost-sensitive and, in most cases, add significant cost to the overall product. Moreover, even with optimal microlens design, the angle response is still limited and is expected to degenerate as pixel size gets smaller.

The use of a formed polysilicon APS transistor device gate, while a viable solution when provided in CIS (Cmos Image Sensors) according to the prior art, is generally thick and tends to eliminate blue and much of green light.

It would thus be highly desirable to provide a CMOS image sensor that implements transparent elements which provide a useful electrical function and allow light to pass through to: enable better angle response at each pixel; enable better quantum efficiency (QE is a measure of the amount of signal measured compared to the amount of light incident on a sample) and, enables "extreme" image sensor scaling.

SUMMARY OF THE INVENTION

The invention relates generally to improved semiconductor imaging devices and in particular to an imaging device which can be fabricated using a standard CMOS process.

More particularly, the invention is directed to a CMOS image sensor that implements transparent conductive materials for wiring. Such a CMOS image sensor implementing a transparent conductive material for wiring allows for light to pass through the wiring to: enable better angle response; enable better quantum efficiency (QE), and, enables "extreme" scaling.

In one embodiment, the transparent conductive material for wiring is formed over a photo-detecting region (e.g., a photodiode). Moreover, the transparent conductive material for wiring can be used as an optical element with the dielectric constant of the wiring enabling different optical properties. For example, the use of the transparent conductive material at a specific dielectric constant may help to better focus the light on the pixel. Optionally, the shape of the wiring may be tailored for optimized optical properties. Thus, for example, an organic microlens shaped structure may function as a conductive wire. Moreover, the transparent conductive material wiring can be used as a light filter.

Exemplary materials which may be used include Indium Tin Oxide or like dielectric material.

Alternately, a polysilicon material that exhibits light-absorbing properties may be implemented as wiring that absorbs some light depending upon its thickness. Thus, for example, polysilicon wiring formed over blue pixels or blue and green may filter out blue and green light, respectively. Moreover, an amorphous poly-Si layer may be used as a color filter; i.e., different poly-Si layer thicknesses result in various optical filtering properties.

Thus, according to one aspect of the invention, there is provided a CMOS imager comprising active pixel cells, each active pixel cell comprising:

a substrate;

a photosensing device formed at or below a substrate surface for collecting charge carriers in response to light incident thereto; and, one or more light transmissive conductive wire layers formed above the photosensing device, a portion of the one or more conductive wire layers being located in an optical path above the photosensing device, a one or more conductive wire layer providing both an electrical function and, an optical function.

For providing an optical function, the image sensor comprises a conductive transparent material of a dielectric material, for example, formed over a light receiving structure in the substrate, the dielectric material formed of a thickness that can be selected to tune for transmissivity. A thickness can also be selected to partially block certain wavelengths of light.

The electrical functions provided by the light transmissive conductive material includes use as an interconnect, a capacitor plate, a resistor, etc.

In one embodiment, the thickness of the conductive transparent material can be the same over all types of pixels of the image sensor array, or can be tuned to a different thickness for different color pixels. Some pixels (selected by color) may be excluded from having wiring over them. In one embodiment, the thickness of the conductive transparent material wiring can be a single wire or multiple wires over the cells. Thus, for example, a wire having a single thickness may be run over red and green and not blue pixels; or, alternatively, two levels of wiring may be provided with one wire having a single thickness over red and green pixels and not blue pixels, and then a second wire having a single thickness over just red and NOT green and blue pixels.

In another embodiment a single level of wiring may be provided in addition to a single wire having varying thicknesses along its length corresponding to the pixels over which it traverses, e.g., thickest over the red, less thick over the green and thinnest or absent over the blue.

Thus, according to a further aspect of the invention, there is provided a CMOS imager comprising active pixel cells, each active pixel cell comprising:

a substrate;

a photosensing device formed at or below a substrate surface for collecting charge carriers in response to light incident thereto; and, one or more light transmissive conductive wire layers formed above the photosensing device, a portion of the one or more conductive wire layers being located in an optical path above the photosensing device, wherein the one or more conductive wire layers are tuned in thickness to filter light appropriate to a color pixel scheme.

Moreover, the wiring can completely cover or only partially cover the cell. The wiring can be multiple levels and be formed above normal (Cu or Al) wiring.

In a further embodiment, a transmissive conductive material may be used to form a microlens structure providing the ability to focus incident light to the pixel's photosensing device.

Thus, according to a further aspect of the invention, there is provided a CMOS imager comprising active pixel cells, each active pixel cell comprising:

a substrate;

a photosensing device formed at or below a substrate surface for collecting charge carriers in response to light incident thereto; and, a microlens array structure formed over the array of color pixel cells, a microlens of the array structure corresponding to a respective photosensing device of the color pixel cells, wherein the microlens array structure is formed of a light transmissive conductive material dimensioned to focus light to the photosensing device, the microlens array providing an electrical function.

In a further embodiment, the light transmissive conductive material provides an electrical function (e.g. interconnect, capacitor plate, resistor, etc.).

Advantageously, by adding wiring of selected highly transparent materials (examples polysilicon, Carbon nanotubes, etc.) over the active region of the cell, the levels of standard BEOL wiring can be decreased without increasing the pixel size. BEOL wiring is very expensive and has low density so that the result is both an improved collection angle and lower manufacturing cost.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF PREFERRED EMBODIMENTS

Prior to describing the present invention in detail, it is instructive to note that the present invention is preferably used in, but not limited to, a CMOS active pixel sensor. Active pixel sensor (APS) refers to an active electrical element within the pixel, other than transistors functioning as switches. For example, the floating diffusion or amplifier are active elements. CMOS refers to complementary metal oxide silicon type electrical components such as transistors which are associated with the pixel, but typically not in the pixel, and which are formed when the source/drain of a transistor is of one dopant type and its mated transistor is of the opposite dopant type. CMOS devices include some advantages one of which is it consumes less power.

Figure 5A:
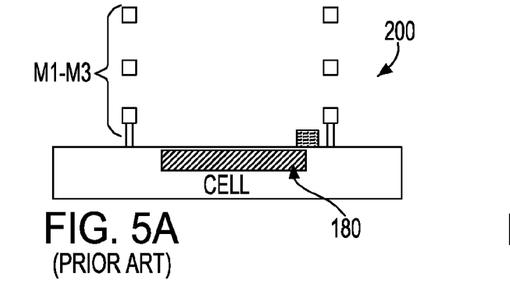
FIGS. 5A-5D illustrate, through cross-sectional views, the CMOS APS cell having invisible wiring formed in accordance with the various embodiments of the invention.
Figure 5B:
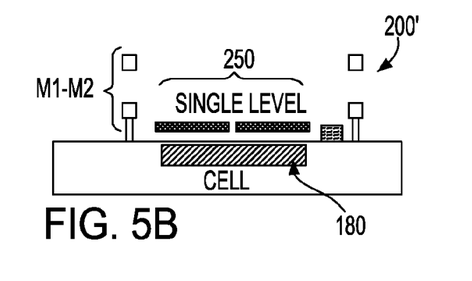

FIG. 5A illustrates, through a cross-sectional view, a back end of line CMOS imager APS cell 200 fabricated according to a conventional process of record. As shown in FIG. 5A, the structure 200 requires that the wiring directly above the photosensing element (e.g., photodiode) 180 be avoided due to reduction in cell efficiency. This thus requires three metallization wiring levels M1-M3 as depicted. However, in the back end of line CMOS imager APS cell 200' fabricated in accordance with one embodiment of the invention as shown through a cross-sectional view of FIG. 5B, an "invisible", i.e., substantially transparent, conductive structure 250 of a material selected from example materials, including, but not limited to: polysilicon, Carbon Nanotube, Indium Oxide, Indium tin oxide, conductive oxides or nitrides, organic conductive polymers (e.g., pentacene), etc, is formed as a single wiring layer directly above the cell's photosensing element 180 with limited reduction in cell collection efficiency. Although two substantially transparent, conductive structures are shown with a gap in between, it is understood that one or several substantially transparent conductors may be present over a pixel. One advantage of providing a single invisible wiring structure 250 over the cell is the concomitant decrease in the number of metallization wiring levels to levels M1-M2 as shown in FIG. 5B. Thus, provision of the invisible wiring structure 250 in the embodiment as depicted in FIG. 5B advantageously results in a wider collection angle, lower cost, improved density, etc.

Figure 5C:
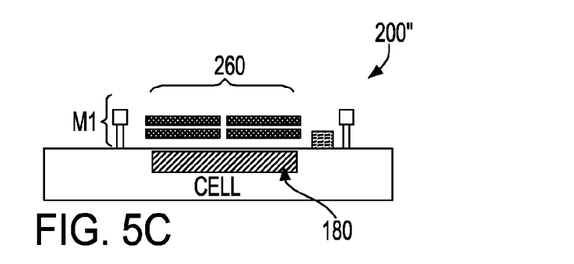

According to a further embodiment of the invention, as shown through a cross-sectional view in FIG. 5C, a CMOS imager APS cell 200" is fabricated that includes a conductive structure 260 of a substantially transparent (light transmissive) material selected from example materials, including, but not limited to: polysilicon, Carbon Nanotube, Indium Oxide, Indium tin oxide, conductive oxides or nitrides, organic conductive polymers (e.g., pentacene), etc. The conductive structure 260 comprises a multi-level (two or more levels) invisible wiring structure according to this embodiment of the invention and is formed directly above the cell's photosensing element 180. For this embodiment, a second poly (or other conductor) deposition, including isolating dielectrics, is formed and etched to define structures. One advantage of providing the multi-level invisible wiring structure 260 over the cell is the concomitant decrease in the number of metallization wiring levels, e.g., to a single level M1, as shown in FIG. 5C. Thus, provision of the invisible wiring structure 260 in the embodiment as depicted in FIG. 5C advantageously results in a sensor array having reduced thickness.

Figure 5D:
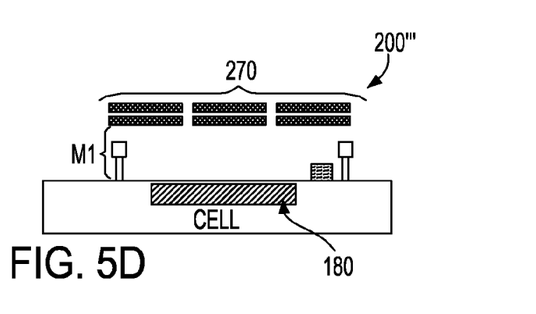

According to a further embodiment of the invention, as shown through a cross-sectional view in FIG. 5D, a CMOS imager APS cell 200''' is fabricated that includes a single or multi-level conductive structure 270 located above the normal wiring metallization levels, e.g., a metallization layer M1 as depicted in FIG. 5D. Preferably, the conductive structure 270 is a multi-level "invisible" wiring structure 270 formed of a substantially transparent material selected from example materials, including, but not limited to: polysilicon, Carbon Nanotube, Indium Oxide, Indium tin oxide, conductive oxides or nitrides, organic conductive polymers (e.g., pentacene), etc. The invisible wiring structure 270 according to this embodiment of the invention is formed as a single (not shown) or multi-level layer structure directly above the cell's final metallization level M1 in the pixel's optical path above the photosensing element (cell) 180. One advantage of providing the multi-level invisible wiring structure 270 over the cell is the decrease in the number of metallization wiring levels, e.g., to a single level M1, as shown in FIG. 5D.

Figure 6A:
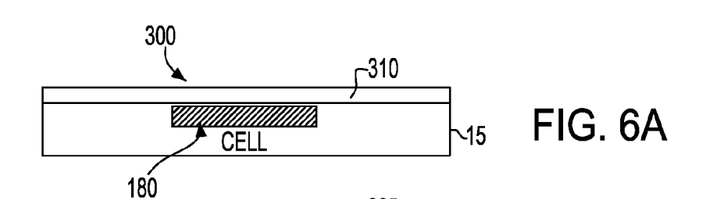
FIGS. 6A-6C depict, through cross-sectional views, a process for forming the CMOS imager APS pixel 300 according to one example embodiment of the invention.
Figure 6B:
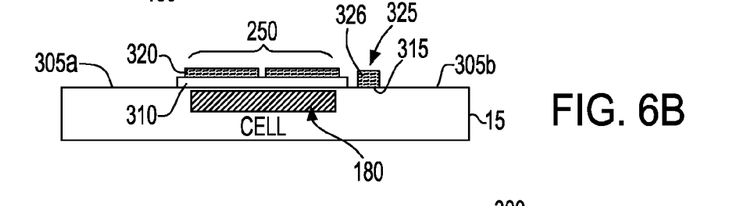
Figure 6C:
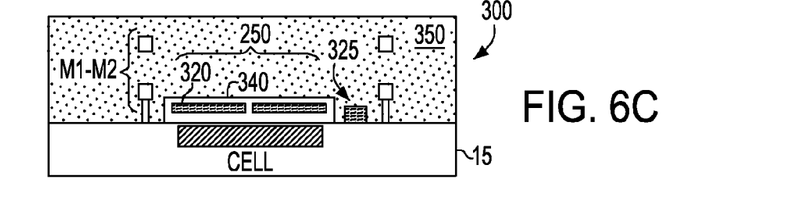

FIG. 6A-6C depict through cross-sectional views, a process for forming the CMOS imager APS pixel 300 according to one example embodiment of the invention and particularly, process steps for forming the single invisible wiring layer 250 embodiment in the CMOS APS cell 200' of FIG. 5B. As shown in FIG. 6A, the pixel cell includes a photoelectric conversion element, e.g., a photodiode 180, formed at the surface of a semiconductor substrate 15. Preferably, the substrate 15 may be a bulk semiconductor including, for example, Si, SiGe, SiC, SiGeC, GaAs, InP, InAs and other III-V compound semiconductors, II-VI, II-V, etc. compound semiconductors, or layered semiconductors such as silicon-on-insulators (SOI), SiC-on-insulator (SiCOI) or silicon germanium-on-insulators (SGOI), or insulating substrates, such as quartz or alumina. A thin barrier or capping layer, e.g., a nitride such as $Si_3N_4$ layer, may be optionally be deposited on top the Si substrate 15 surface. Then, there is performed the step of depositing a thick layer of dielectric material layer 310 above the imager cell 180 that extends across the cell 180 of the imager array. The dielectric material may comprise a semiconductor oxide, a metal oxide, nitride or oxynitride and may comprise a stack (multilevel) dielectric material structure and may be deposited to a thickness ranging between 10 nm and 1 um. Continuing, through a lithographic processing technique, portions of the thick dielectric layer 3 1 0 are removed from non-wiring areas 305a, 305b as shown in FIG. 6B. This may involve creating or providing a hard mask structure and applying one or more etch processes, e.g., RIE, to remove those dielectric portions from the sides of the imager array cell 180. As shown in FIG. 6B, a thin dielectric layer 315 may be formed which performs the function of gate oxide for an active pixel device 325. Then, a substantially transparent conductive material layer, e.g., polysilicon layer 320, is deposited over the structure of FIG. 6A which will be processed to eventually form the conductive gate conductor and substantially transparent wiring structures. The polysilicon can be deposited by any number of know processes like LPCVD, LTP, etc. More specifically, the gate and wiring conductor material, e.g., polysilicon, is deposited and subject to a chemical mechanical process (CMP) or RIE etch to thin the wiring to be eventually formed over the cells to a specified thickness. Finally, as shown in FIG. 6B, utilizing a resist mask, develop and etch processes known in the art, the polysilicon (or substantially transparent conductive material) 320 is etched to form the gate conductor 326 of active device 325 and, is etched to form a single level of polysilicon wiring conductors 250 of a desired thickness that resides over the active photosensitive cell 180 as in FIG. 5B. Although two spaced apart conductive substantially transparent wires 250 are shown, it is understood that there may be one or many wires 250 formed by the process steps depicted. Continuing, although not shown in the figures, a nitride layer deposition process may be then performed to protect the substantially transparent conductive (e.g., polysilicon) wiring 250 above the cell while the active device 325 is being formed. As part of the process for forming the device 325, which may be a MOS transistor having drain and source diffusion regions, a silicidation step is then performed to fabricate contact silicide terminals for the drain and source diffusions using silicide fabrication techniques well known in the art. Thus, a thin dielectric (e.g., nitride) layer 340 is formed over the formed substantially transparent conductive (e.g., polysilicon) wiring 250 above the cell to protect the transparent conductive wiring 250 during the device salicidation process. Then, as shown in FIG. 6C a thick dielectric material layer 350, e.g., $SiO_2$, is deposited and contact layers formed as is metallization lines M1 and M2 during BEOL processing. Thus, in an example embodiment, a methodology is implemented for forming any of the metallization layers M1, M2 including first depositing the $SiO_2$ or other thick dielectric layer 350, e.g., to a thickness ranging between about 2 kÅ to 20 kÅ with a range of between 4 kÅ and 8 kÅ preferred, patterning trenches in the $SiO_2$ layer using known lithography and RIE techniques, and, lining the formed trenches with a metal liner such as one or more refractory metals, e.g., Ta, TaN, TiN, TiSiN, W, WCN, Ru. Then, the lined trenches are filled with a copper material to form the Cu M1 layer which may be subsequently polished using a known CMP technique.

It is understood that the light (e.g., color) filtering function that the substantially transparent conductive wiring provides in the CMOS imager cell is configurable. Thus, for instance, by repeating the lithographic processing steps of depositing the dielectric layer and overlying transparent conductive material, e.g., polysilicon, organic conductive polymer or conductive oxide, several layers of wiring may be provided that each provides a filter function. Alternatively, as will be described in greater detail hereinbelow, the thickness of a single polysilicon wire maybe altered depending upon the color filtering function (light absorption characteristics) the polysilicon wiring exhibits.

Figure 7A:
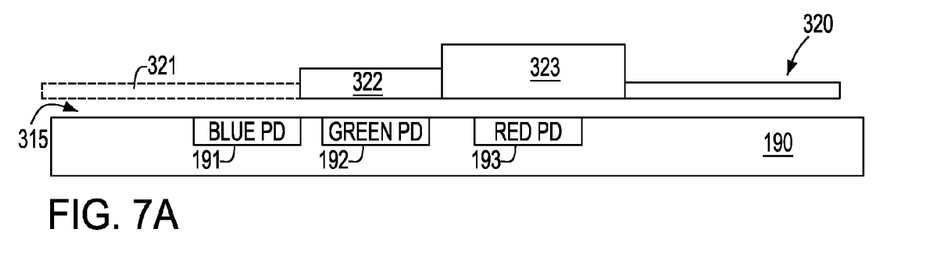
FIGS. 7A-7B depict, through cross sectional views, respective single levels of wiring having varying thicknesses along its length corresponding to the color boundaries of pixels over which the wire traverses.
Figure 7B:
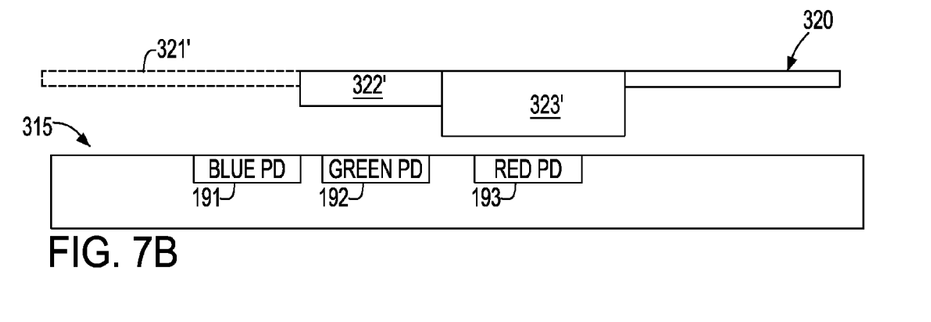

According to a first embodiment of the invention, the transparent wiring levels perform a light filtering function for a pixel. That is, in one embodiment, the thickness of the conductive invisible wiring structures can be selected to tune for transmissivity, or, can be selected to partially block certain wavelengths. Thus, for example, as shown in FIGS. 7A and 7B, a cell 190 comprising photosensing devices for blue pixel region 191, green pixel region 192 and red pixel region 193 may have a polysilicon layer 320 formed above a dielectric material layer 315 having three different thicknesses depending upon the color pixel region over which it is formed. Thus, for example, a thin (or no) polysilicon wiring 321 may be formed over blue color pixel region 191; a thicker polysilicon wiring 322 may be formed over green color pixel region 192 and a yet thicker polysilicon wiring 323 may be formed over the red color pixel region 193. In an exemplary embodiment, a blue pixel would require a polysilicon wiring 321 that is about 300 Å or less in thickness; the red pixel would require a polysilicon wiring 322 that is about 1500 Å or less to about 4 kÅ in thickness; and, the green pixel would require a polysilicon wiring 323 that is about 500 Å or less, to about 2 kÅ in thickness.

FIG. 7A particularly depicts a methodology that involves a deposition of a thick polysilicon layer 320, e.g., to the thickness of the polysilicon layer 323 for the red pixel region, and the masking and selective etching and removal of the polysilicon layer 320 above the blue and green pixel regions to result in the formation of the polysilicon wiring shown in FIG. 7A.

Alternately, as shown in FIG. 7B, tie methodology may comprising masking and etching the dielectric layer 315 formed over the cell to different depths, dependent upon the color pixel region and subsequently performing a polysilicon fill and CMP so as to retain the relative thicknesses required for the blue pixel region 191, green pixel region 192 and red pixel region 193. Thus, by etching trenches in dielectric layer 315, performing poly fill and polishing, the polysilicon wiring results having a thin (or no) polysilicon wiring 321' formed over blue color pixel region 191; a thicker polysilicon wiring 322' be formed over green color pixel region 192 and a yet thicker polysilicon wiring 323' be formed over the red color pixel region 193 as shown in FIG. 7B.

Figure 8:
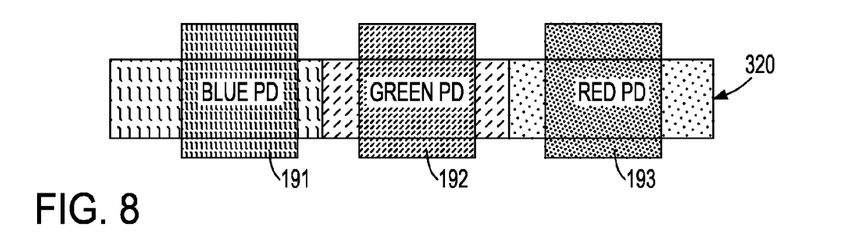
FIG. 8 depicts an example conductive wiring 320 shown partially covering the pixel photodiode area according to the invention.

Moreover, the transparent conductive wiring can completely cover or only partially cover the cell, i.e., the wiring 320 may completely or partially cover the pixel photodiode area as shown in the top plan view of FIG. 8. The wiring can be multiple levels and be formed above normal (Cu or Al) wiring. Moreover, the wiring pattern could be altered to allow only two thicknesses or one thickness. Thus, in another example, a wire of a single thickness, e.g., 250 Å thick, is formed only over red pixels and green pixels, with the pixels additionally supplemented with CFA (color filters) as needed. When using a wire of two thicknesses, the wire may be formed over two of the pixels differently, with the third color pixel additionally supplemented with CFA (color filters) as needed. When using wires of multiple levels, e.g., two levels of polysilicon wiring on separate layers, the sum of the polysilicon wiring thicknesses wired on separate layers can be used to tailor the optical performance of that pixel, e.g., polysilicon wiring at 0 thickness; one poly wire at thickness "a"; one poly wire of thickness "b"; and, the sum of the two polysilicon wires of total thickness a+b. It is understood that, the two-level wiring embodiment may alternatively comprise a wire of polysilicon and another conductive wire structure of another material.

In the embodiment described herein with respect to FIGS. 7A-7B, a single level of wiring may be provided in addition to a single wire having varying thicknesses along its length corresponding to the color boundaries of pixels over which it traverses, e.g., thickest over the red, less thick over the green and thinnest or absent over the blue. It is understood however, that various imager array cell configurations are possible. For example, in one embodiment, the thickness of the conductive transparent material may be the same over all types of pixels of the image sensor array, or can be tuned to a different thickness for different color pixels. Some pixels (selected by color) may be excluded from having wiring over them. In one embodiment, the thickness of the substantially transparent conductive material wiring can be a single wire or multiple wires over the cells. Thus, for example, a transmissive conductive wire having a single thickness may be run over red and green and not blue pixels; or, alternatively, two levels of wiring may be provided with one wire having a single thickness over red and green pixels and not blue pixels, and then a second wire having a single thickness over just red and not the green and blue pixels.

Figure 9:
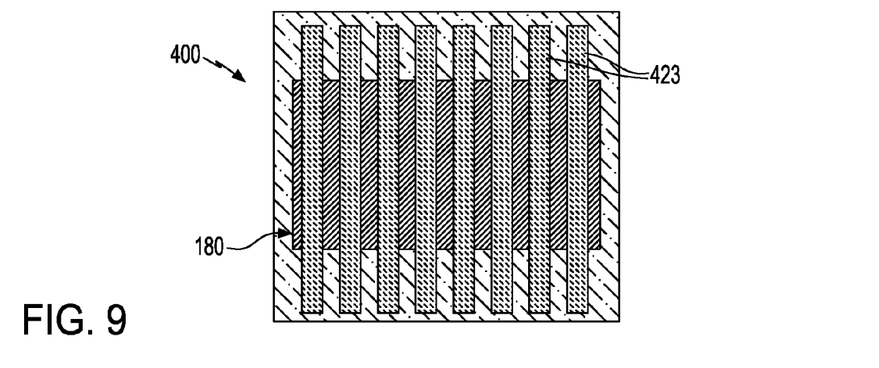
FIG. 9 illustrates, through a top-plan view, an alternate embodiment of the CMOS image sensor array of the invention incorporating a "waffle"-type conductive pattern; and, FIG. 10, illustrates, the formation of a continuous micro lens structure 475 comprising an organic conductor material.

Thus, with little additional processing the invention enables alternate color pixel pattern designs that differ from the traditional Bayer pixel pattern design typically found in the matrices of CMOS sensor chips. For example, FIG. 9 illustrates, through a top-plan view, an alternate embodiment of the CMOS image sensor array of the invention incorporating a "stripe"-type conductive pattern. In this example embodiment, for example, multiple substantially transparent conductor lines 423 are formed that extend across the pixel cell array that filter only the green pixels that are formed at every other pixel location on the line (due to 50% green pixels according to the Bayer pattern). Note the wires 423 may comprise a ground plane or Vdd voltage, for example. In such an embodiment, red organic filter may be used for the red pixels and likewise, a blue organic filter for the blue pixels. It is understood that alternate color pixel patterns may be devised for ease of wiring (e.g., all green pixels along a column). In addition, a waffle pattern may be constructed by incorporating two stripe type patterns in perpendicular directions. This would result in a regular array with a 2×2 pattern. One pixel with 2 wires, two with 1 wire, and 1 with no wires.

Figure 10:
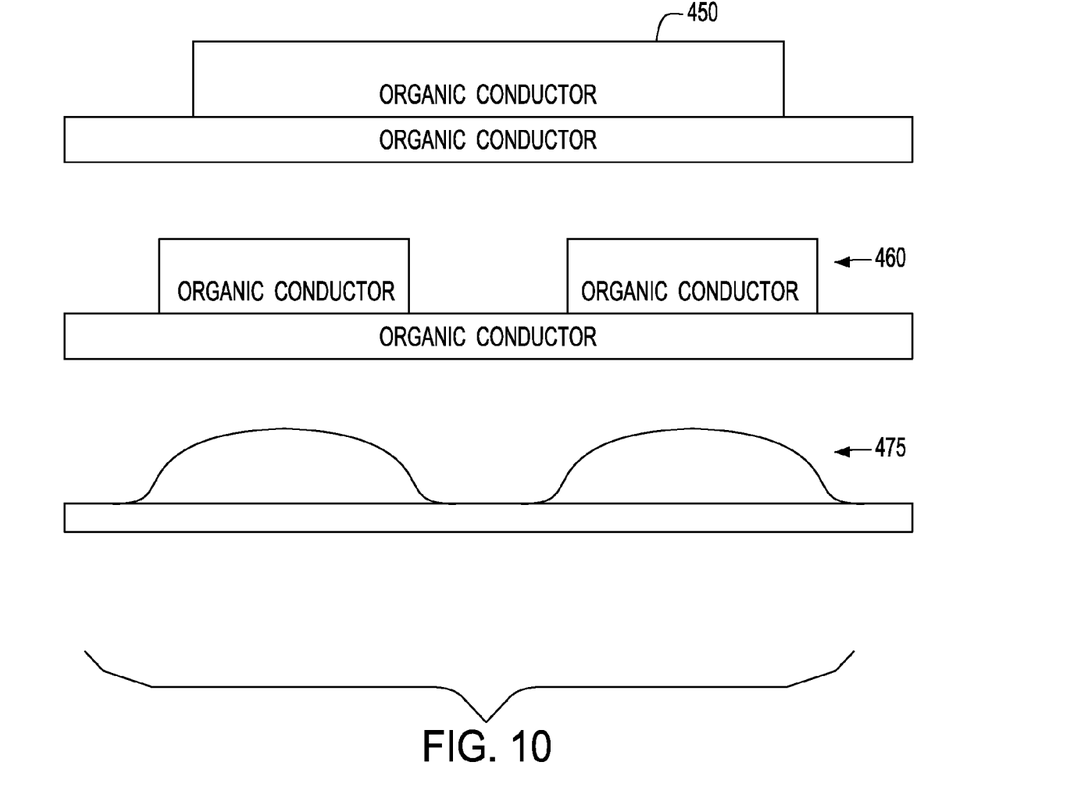

In a second embodiment of the invention, a substantially transparent conductive material may be used as an optical element. That is, the wiring may be shaped for best optical properties. In another embodiment, substantially transparent conductive material may be used as a Microlens structure to help focus light on the pixel. In this embodiment, an organic conductor material, e.g., pentacene, may be used and shaped using conventional processing techniques to form the microlens array structure. For example, as shown in FIG. 10, an organic conductor material such as pentacene 450 may be first deposited on a substrate or other conductor pattern, and then patterned (such as by RIE technique) 460 and heated to a temperature (e.g., of about 200-300° C.) that is sufficient to cause the formation of a continuous micro lens structure 475. Alternately, a conductive organic may be used whereby a microlens is formed in the resist and the structure is etched uniformly so that the imprint of the formed microlens forms in the material (organic conductor) to be etched. As the formed microlens structure is common to all pixels in the array, the conductive microlens structure may function as a low resistance Vdd voltage supply plane as all pixels are wired to a Vdd voltage level. In this case, there would require some electrical connection formed between one of the wiring levels and the microlens structure. The substantially transparent conductive material used as a microlens structure may be broken at any point and spaced apart, e.g., along a row or column, or, over a pre-determined array, to provide a conductor wire structure for a respective pixel row or column, or a pixel array, for example. While exemplary embodiments describe the wiring as comprising a polysilicon, it is understood that other substantially substantially transparent conductor material, e.g., Indium Oxide, Indium tin oxide, or organics (e.g., pentacene) or even carbon nanotubes, etc. may be used. When using these other conductive materials, care is taken to ensure that the dielectric constant of these materials is sufficiently different than the dielectric constant of the material surrounding the lens to perform the intended optical function. Note that the microlens structure formed out of the conductive material, e.g., polysilicon, ITO, etc., may be employed in a sensor array having polysilicon wiring color filters, and/or passive devices formed of substantially transparent conductive material as described herein.

In a third embodiment of the invention, a substantially transparent conductive material may be used to form a passive device in the pixel. Thus, for example, two very thin polysilicon layers (or other substantially transparent materials), e.g., formed according to the techniques described herein, maybe formed over the photodiode to comprise two plates of a capacitor device that may be used in the pixel circuitry without talking extra space. Besides the use of two very thin polysilicon layers as capacitor plates, other passive devices may be formed with appropriate shaping of the conductive material, but not limited to: resistors, and potentially transistors.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A CMOS imager comprising active pixel cells, each active pixel cell comprising:
   a substrate;
   a photosensing device formed at or below a substrate surface for collecting charge carriers in response to light incident thereto; and
   a single light transmissive conductive wire structure formed above said photosensing device, single light transmissive conductive wire structure having a planar upper surface and being located in an optical path above said photosensing device, said single light transmissive conductive wire structure providing both an electrical function and an optical function,
   wherein a thickness of said single light transmissive conductive wire structure is different when formed over different color pixel cells.

2. The CMOS imager as claimed in claim 1, wherein said optical function includes filtering light incident to said photosensing device.

3. The CMOS imager as claimed in claim 1, wherein said optical function includes focusing light onto said photosensing device.

4. The CMOS imager as claimed in claim 1, wherein said electrical function includes carrying current, the single light transmissive conductive wire structure comprises an interconnect structure.

5. The CMOS imager as claimed in claim 1, wherein the single light transmissive conductive wire structure comprises a capacitor plate.

6. The CMOS imager as claimed in claim 1, wherein the single light transmissive conductive wire structure comprises a resistor structure.

7. The CMOS imager as claimed in claim 2, wherein said single light transmissive conductive wire structure comprises one of: a polysilicon material, an organic conductive polymer material, a conductive dielectric material or, one or more Carbon nanotubes.

8. The CMOS imager as claimed in claim 2, wherein said single light transmissive conductive wire structure comprises Indium Tin Oxide (ITO).

9. The CMOS imager as claimed in claim 3, wherein the single light transmissive conductive wire structure comprises a microlens structure for focusing said light onto said photosensing device via said optical path.

10. A CMOS imager array of color pixel cells, each color pixel cell comprising:
    a substrate;
    a photosensing device formed at or below a substrate surface for collecting charge carriers in response to light incident thereto; and a single light transmissive conductive wire structure formed above said photosensing device, a portion of said single conductive wire structures being located in an optical path above said photosensing device, wherein single conductive wire structure are tuned in thickness to filter light appropriate to a color pixel scheme and said single conductive wire structure has a planar upper surface, wherein the thickness of said single conductive wire structure is different when formed over different color pixel cells.

11. The CMOS imager array as claimed in claim 10, wherein said single light transmissive conductive wire structure comprises polysilicon material, said polysilicon material having a first thickness for formation over a first color pixel cell, and a second thickness for formation over a second color pixel cell.

12. A CMOS imager array of color pixel cells formed on a substrate, each color pixel cell comprising a photosensing device formed at or below a substrate surface for collecting charge carriers in response to light incident thereto, said imager array comprising: a microlens array structure formed over said color pixel cells with a microlens corresponding to a respective photosensing device of said color pixel cells, wherein said microlens array structure is formed of a single light transmissive conductive material dimensioned to focus light to said photosensing device and providing an electrical function, wherein a thickness of said single light transmissive conductive material is different when formed over different color pixel cells.

13. The CMOS imager as claimed in claim 12, wherein said electrical function includes one of: a capacitor plate function, a resistive function, or an interconnect function.

14. The CMOS imager as claimed in claim 12, wherein said electrical function includes a power supply function for providing a predetermined voltage to CMOS imager processing circuits associated with a color pixel cell.

* * * * *